United States Patent [19]

Jordan et al.

[11] 4,178,395

[45] Dec. 11, 1979

[54] METHODS FOR IMPROVING SOLAR CELL OPEN CIRCUIT VOLTAGE

[75] Inventors: John F. Jordan; Vijay P. Singh, both of El Paso, Tex.

[73] Assignee: Photon Power, Inc., El Paso, Tex.

[21] Appl. No.: 855,887

[22] Filed: Nov. 30, 1977

[51] Int. Cl.$^2$ .................. H01L 31/18; H01L 31/06
[52] U.S. Cl. .................... 427/74; 427/87; 427/88; 427/123; 427/125; 427/248 R; 427/343; 427/377; 427/430 B; 29/572; 204/52 R; 136/89 TF; 136/89 CC; 136/89 CD
[58] Field of Search .............. 427/74, 343, 125, 123, 427/87, 88, 377; 136/89 CC, 89 CD, 89 TF; 29/572

[56] References Cited

U.S. PATENT DOCUMENTS

| 3,148,084 | 9/1964 | Hill et al. | 427/74 |
|---|---|---|---|
| 3,472,690 | 10/1969 | Hill | 136/89 CD |
| 3,880,632 | 4/1975 | Jordan | 427/74 |
| 3,902,920 | 9/1975 | Jordan | 136/89 CD |
| 3,988,167 | 10/1976 | Kressell | 136/89 CC |
| 4,039,357 | 8/1977 | Bachmann | 136/89 CD |

OTHER PUBLICATIONS

Sorum, *Introduction to Semimicro Qualitative Anal.*, Prentice Hall Inc. (N.J.) (1949) p. 5.

*Primary Examiner*—Michael F. Esposito
*Attorney, Agent, or Firm*—Bard & Groves

[57] ABSTRACT

A method for producing a solar cell having an increased open circuit voltage. A layer of cadmium sulfide (CdS) produced by a chemical spray technique and having residual chlorides is exposed to a flow of hydrogen sulfide ($H_2S$) heated to a temperature of 400°–600° C. The residual chlorides are reduced and any remaining $CdCl_2$ is converted to CdS. A heterojunction is formed over the CdS and electrodes are formed. Application of chromium as the positive electrode results in a further increase in the open circuit voltage available from the $H_2S$-treated solar cell.

8 Claims, No Drawings

METHODS FOR IMPROVING SOLAR CELL OPEN CIRCUIT VOLTAGE

U.S. GOVERNMENT RIGHTS

The Government has rights in this invention pursuant to Contract No. E(29-2)-3579 awarded by the U.S. Energy Research and Development Administration.

FIELD OF THE INVENTION

This invention relates to $CdS$—$Cu_2S$ photovoltaic cells and, more particularly, to $CdS$—$Cu_2S$ photovoltaic cells where the CdS layer is polycrystalline and formed by a chemical reaction involving a plurality of compounds on a heated surface.

BACKGROUND OF THE INVENTION

One species of photovoltaic cells currently under development employs cadmium sulfide (CdS) and cuprous sulfide ($Cu_2S$) which act to form a heterojunction at the interface of the two materials. The CdS may conveniently be provided in a polycrystalline form rather than a single crystal, and the heterojunction formed by converting a portion of the crystalline surfaces to $Cu_2S$. The efficiency of the $CdS$—$Cu_2S$ photovoltaic cells has traditionally been lower than the efficiency available from photovoltaic cells using the more expensive silicon, and much effort is being expended to improve the efficiency of the $CdS$—$Cu_2S$ species of photovoltaic cells.

One developing technique for forming the polycrystalline CdS layer employs a technique for depositing CdS by spraying a chemical solution on a heated substrate. Particular embodiments of such techniques are more particularly described in U.S. Pat. Nos. 3,880,633 and 3,902,920, and in U.S. Pat. Application Ser. No. 631,815 now U.S. Pat. No. 4,086,101 and Ser. No. 670,625 now U.S. Pat. No. 4,095,006. These techniques, briefly, involve heating a glass substrate to substantially a uniform temperature, spraying a first compound to form a layer of electrically conductive tin oxide on the glass, spraying one or more compounds which react on the heated tin oxide surface to form a layer of CdS in the range of four microns thick, annealing the completed films in dry air, forming a layer of $Cu_2S$ on the surface of the CdS, vacuum depositing electrode materials and then heat treating the completed cell. Formation of the CdS layer involves the use of various cadmium salts, including cadmium chloride. Residual chlorides remain in the CdS crystal structure after the CdS film has been formed to the desired thickness. The residual chlorides are desirable at this stage to enhance the growth of the CdS crystallites in subsequent heat treating operations. However, it has been found that the presence of residual chlorides in the CdS film appear to accelerate the degradation of the performance of the photovoltaic cells throughout the cell lifetime. In addition, the presence of chlorides adjacent the surface of the CdS crystallites appears to effect heterojunction formation and reduce the available open circuit voltage.

A conventional metal used to form the positive electrodes on photovoltaic cells has been copper. Copper is abundant and easily applied but produces some unfavorable results. First, copper does not always make good ohmic contact with the $Cu_2S$ layer, and a reduced cell output voltage results. Second, copper tends to diffuse throughout the photovoltaic cell over the operating lifetime of the cell. This diffusion is accelerated by high temperatures, such as the final heat treatment of the completed cell, or such as might occur in certain operating locales. It is, therefore, desirable to investigate alternate electrode materials which do not act to degrade photovoltaic cell performance.

The disadvantages of the prior art, however, are overcome by the present invention and improved methods are provided for fabricating a photovoltaic cell having chromium positive electrodes and producing an improved open circuit output voltage.

SUMMARY OF THE INVENTION

In a preferred embodiment of the present invention, a layer of cadmium sulfide produced according to a chemical spray technique is subjected to a flow of hydrogen sulfide ($H_2S$) gas heated to a temperature of 400°–600° C. in order to remove residual chlorides and/or to convert any remaining $CdCl_2$ to CdS. The upper layer of CdS is then converted to $Cu_2S$ and chromium is evaporated over the layer of $Cu_2S$ to form a positive electrode.

It is a feature of the present invention to improve the open circuit voltage of a photovoltaic cell by reducing residual chlorides in the CdS layer.

It is yet another feature of the present invention to improve the open circuit voltage of photovoltaic cells by applying chromium to form a positive electrode.

It is yet another feature of the present invention to further enhance the improved open circuit voltage resulting from the removal of residual chlorides by the application of chromium electrodes.

Yet another feature of the present invention is to pass heated $H_2S$ over the surface of the CdS film to remove residual chlorides.

One other feature of the present invention is improved photovoltaic cell lifetime resulting from the removal of residual chlorides and the reduction in copper diffusion through the photovoltaic cell.

These and other features and advantages of the present invention will become apparent from the following detailed description of the preferred embodiment.

DETAILED DESCRIPTION

An evolving technique for the production of photovoltaic cells of the $CdS$—$Cu_2S$ species on a production basis involves spraying compounds on a heated substrate where the compounds chemically react to form the desired film component of the photovoltaic cell. Typically, a photovoltaic cell comprises a substrate, which may be glass where a transparent substrate is desired; a conductive layer, which may conveniently be tin oxide which is non-stoichiometric and which is formed by a chemical spray technique; a first microcrystalline component of a heterojunction, which may be cadmium sulfide (CdS) and formed by a chemical spray technique; a second microcrystalline component of the heterojunction, which may be $Cu_2S$ and which is formed by converting a portion of the CdS to $Cu_2S$; and negative and positive electrodes which contact the electrically conductive layer and the $Cu_2S$ layer, respectively. The electrode contacting the $Cu_2S$ layer forms the positive electrode and may be conventionally formed of copper. The compounds which react on the heated substrate to form the cadmium sulfide layer typically contain chlorides, either in the form of $CdCl_2$ or compounded with another material which disassociates readily in an aqueous solution to release the chlorides.

It is theorized that the presence of chlorides acts to enhance the growth of the CdS microcrystals during subsequent heat treatment of the CdS polycrystalline layer. It is desirable to obtain the growth of large crystals in order to improve the conversion efficiency of the photovoltaic cells. Accordingly, it is very desirable to include chlorides when the CdS is formed and when the crystal size is increased in subsequent annealing operations.

It is postulated, however, that the continued presence of chlorides in the CdS film acts to degrade the performance of the photovoltaic cell throughout the life of the cell. The exact mechanism producing the degradation is unknown but the residual chlorine may well interfere with the stoichiometry of the $Cu_2S$ layer to reduce cell efficiencies or may provide recombination sites in the depletion region adjacent the heterojunction, resulting in reduced shunt resistance and lower open circuit voltage.

According to the present invention, the residual $CdCl_2$ is removed by passing a heated hydrogen sulfide gas ($H_2S$) over the surface of the CdS. It is believed that the residual $CdCl_2$ is possibly removed by the following reaction:

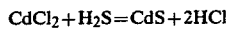

$$CdCl_2 + H_2S = CdS + 2HCl$$

Thus, removing the chloride is thought to improve the stoichiometry of the layer containing CdS whereby an essentially stoichiometric layer results. Some residual chlorides or other impurities may remain, however, and the CdS layer is not exactly stoichiometric.

According to one embodiment of the present invention the substrate coated with CdS is moved to an annealing furnace and the temperature raised to a value of 400°–600° C. An inert nitrogen atmosphere is used in the furance and the temperature is allowed to stabilize. $H_2S$ is then introduced into the gas stream until the desired concentration of $H_2S$ is achieved and the coated substrate is heated in this $H_2S$ atmosphere for times ranging from 15 to 90 minutes. The gas mixture in the furnace is again returned to pure nitrogen and the coated substrate is cooled to room temperature.

The temperature at which the $H_2S$ treatment occurs has an influence on the resulting open circuit voltage. Below about 400° C., the $H_2S$ treatment does not appear to produce any change in the open circuit voltage from the open circuit voltage produced by heat treating the cell in dry air. In the temperature range of 400°–500° C., the open circuit voltage increases monotonically to near the maximum value and then continues to increase at a lower rate as the temperature is raised from 500° to 600° C. to the maximum value. The greatest increase in open circuit voltage occurs as the temperature is raised from 400° to 500° C. It has also been found that the sheet resistance of the underlying tin oxide begins to increase when the temperature of the $H_2S$ is raised above 500° C. and, in fact, increases of from 8 to 250 ohms per square have been measured. Thus, a preferred temperature for the $H_2S$ treatment is about 500° C.

It is not required that pure $H_2S$ be used in the treatment. Substantially constant open circuit voltage gains have been obtained with $H_2S$ partial pressures down to 20% of the total gas mixture. It may be preferable to maintain the $H_2S$ concentration as low as possible due to highly toxic nature of the $H_2S$.

Although only $H_2S$ has been used at this time, it is believed that any sulfur-rich atmosphere should be capable of producing the desired results. Thus, other sulfur containing gases which are less toxic than $H_2S$ might be used. It is believed that the heated sulfur treatment makes the topmost part of the CdS film less rich in cadmium than the bulk material. Such a reduction in cadmium acts to decrease the donor density in the CdS and increase the width of the space charge layer, or depletion layer, in the CdS at the heterojunction. This, in turn, reduces the tunneling probability between the CdS and $Cu_2S$ layers and produces reduced diode reverse saturation current and increased open circuit voltage.

It has also been observed that the CdS film which is produced as a result of the $H_2S$ treatment is a harder, tighter adhering film than the CdS film normally produced. This CdS film is resistant to grain boundary penetration by the heterojunction-forming chemicals, such as the cuprous chloride. Thus, the resulting CdS film is somewhat more resistant than other CdS layers to shorting defects caused by copper-containing materials penetrating through to the underlying conductive base.

Next, the heterojunction is formed by converting a portion of the CdS layer to $Cu_2S$. In one acceptable method, the treated cadmium sulfide layer is dipped for 15 to 60 seconds in a solution containing cuprous chloride at room temperature. The dipped layer of CdS is then heat treated in air at about 200° C. for 3–7 minutes. Yet another successful heat treatment includes heating in a partial vacuum (pressure about 400 millitorrs) for 15–30 minutes at about 175° C. The coated substrate is again cooled and the substrate dipped in the cuprous chloride solution for at least 15 seconds. An electroplating process could be substituted for the second dipping step, wherein the coated substrate forms the cathode, a metallic copper foil forms the anode, and a cupric acetate solution is the electrolyte. The desired thickness of copper sulfide may be obtained by application of a plating current density of around 0.4 milliamps per square centimeter for at least 15 seconds. It should be noted, however, that the improved open circuit voltages may not result if the first dip is maintained for longer periods of time and, more particularly, if the dip is maintained for more than about two minutes.

Comparable results have also been obtained when the $Cu_2S$ layer is formed by the "dry" technique. In this method, cuprous chloride is vacuum evaporated over the CdS to the desired thickness. The resulting coated substrate is then heated in air, or in a partial vacuum. If heating in air, a temperature of 200° C. is maintained for about five minutes. If heating in a partial vacuum (pressure about 400 millitorrs) a temperature of 180° C. is maintained for about 30 minutes. The heat treatment drives a chemical reaction where cadmium sulfide is converted to copper sulfide and the cadmium forms cadmium chloride with the residual chlorides from the cuprous chloride. The coated substrate is then washed to remove the top cadmium chloride layer.

The photovoltaic cell is now ready for the application of the positive electrode. It has been found that the increased open circuit voltage resulting from the $H_2S$ treatment is enhanced when the positive electrode is formed from either gold or chromium, rather than from copper. Only a very thin electrode layer thickness of about 0.2 microns is required; and either gold or chromium establishes the required ohmic contact with the Cu$_2$S layer.

It should be noted that an energy band diagram would predict a Schottky-type contact between the chromium and copper sulfide layers rather than an ohmic contact. However, the large conductivity of the Cu$_2$S provides such a narrow depletion layer that the resulting tunneling probability has characteristics equivalent to an ohmic contact.

Chromium, as an electrode for the CdS—Cu$_2$S photovoltaic cells, is preferred over the gold electrode, by reason of cost. Chromium is also not as subject to atmospheric degradation as copper and does not tend to diffuse through the photovoltaic cell over the operating lifetime of the cell as does copper. It has also been found that the voltage increase from the H$_2$S treatment is not obtained from copper electrodes, indicating that copper does not make a good ohmic contact with the layer of Cu$_2$S which is produced on the H$_2$S-treated CdS.

A photovoltaic cell manufactured according to the methods hereinabove discussed produces open circuit voltages up to 100 millivolt (mv) greater than available from conventional cells. The following table is illustrative:

Table I

| Open Circuit Voltage vs. H$_2$S Temperature | |
| --- | --- |
| H$_2$S Temperature (°C.) | Open Circuit Voltage (mv) |
| Control (air treat) | 360 |
| 400 | 380 |
| 450 | 420–450 |
| 500 | 480 |
| 550 | 500 |

The combination of the H$_2$S treatment and the application of chromium electrodes has obtained photovoltaic cells having open circuit voltages as high as 520 mv, and consistently up to about 490 mv. By contrast, photovoltaic cells manufactured without H$_2$S treatment and having copper electrodes consistently produce open circuit voltages around 360 mv, with occasional cells producing up to about 420 mv.

It is therefore apparent that the present invention is one well adapted to obtain all of the advantages and features hereinabove set forth, together with other advantages which will become obvious and inherent from a description of the apparatus itself. It will be understood that certain combinations and subcombinations are of utility and may be employed without reference to other features and subcombinations. This is contemplated by and is within the scope of the present invention.

What is claimed is:

1. In a photovoltaic cell having a layer of polycrystalline CdS, a process for increasing the open circuit cell voltage, comprising the steps of:
   exposing said layer of CdS to a sulfur-containing gas heated to a temperature range of 400°–600° C.
   converting at least a portion of said layer of CdS to Cu$_2$S to obtain a photovoltaic heterojunction; and
   applying a metallic positive electrode over at least a portion of said heterojunction, where said metallic electrode is selected from a group of materials effective to obtain an increased open circuit voltage from said photovoltaic cell.

2. The method of claim 1, wherein said sulfur-containing gas is H$_2$S.

3. The method of claim 1, wherein said metallic electrode is selected from the group comprising gold or chromium.

4. The method of claim 3, wherein said sulfur-containing gas is H$_2$S.

5. In a photovoltaic cell having a layer of polycrystalline CdS formed by a process which leaves residual chlorides, a process for reducing lifetime degradation mechanisms, comprising the steps of:
   exposing said layer of CdS to a stream of H$_2$S heated to a temperature effective to obtain a reduction of residual chlorides;
   converting at least a portion of said layer of CdS to Cu$_2$S to obtain a photovoltaic heterojunction; and
   applying a metallic positive electrode over at least a portion of said heterojunction, where said metallic electrode is selected from a group of materials which are chemically and dimensionally stable over the operating lifetime of said photovoltaic cell.

6. The method of claim 5, including heating said H$_2$S to a temperature range of 400°–600° C.

7. The method of claim 5, wherein said metallic electrode is selected from the group comprising gold or chromium.

8. The method of claim 7, including heating said H$_2$S to a temperature range of 400°–600° C.

* * * * *